United States Patent
Nozieres et al.

(10) Patent No.: US 7,129,555 B2
(45) Date of Patent: Oct. 31, 2006

(54) MAGNETIC MEMORY WITH WRITE INHIBIT SELECTION AND THE WRITING METHOD FOR SAME

(76) Inventors: Jean-Pierre Nozieres, 8, Chemin de Vence, 38700 Corenc (FR); Laurent Ranno, 15, Rue de Bonne, 38000 Grenoble (FR); Yann Conraux, 15, Rue Lafayette, 38000 Grenoble (FR)

(*) Notice: Subject to any disclaimer, the term of this patent is extended or adjusted under 35 U.S.C. 154(b) by 0 days.

(21) Appl. No.: 10/490,490

(22) PCT Filed: Sep. 19, 2002

(86) PCT No.: PCT/FR02/03209

§ 371 (c)(1),
(2), (4) Date: Oct. 13, 2004

(87) PCT Pub. No.: WO03/025946

PCT Pub. Date: Mar. 27, 2003

(65) Prior Publication Data

US 2005/0047206 A1  Mar. 3, 2005

(30) Foreign Application Priority Data

Sep. 20, 2001  (FR) .................................. 01 12123

(51) Int. Cl.
*H01L 29/82* (2006.01)
*H01L 43/00* (2006.01)

(52) U.S. Cl. ............... 257/421; 257/E29.323; 365/62; 365/173; 365/213; 365/225.5

(58) Field of Classification Search .......... 257/421, 257/E29.323; 365/62, 173, 213, 225.5
See application file for complete search history.

(56) References Cited

U.S. PATENT DOCUMENTS

| 4,771,347 A | 9/1988 | Horimai et al. ............... 360/59 |
| 6,090,480 A * | 7/2000 | Hayashi ................... 428/811.2 |
| 6,385,082 B1 | 5/2002 | Abraham et al. ........... 365/171 |
| 2001/0019461 A1 | 9/2001 | Allenspach et al. |
| 2002/0089874 A1 | 7/2002 | Nickel et al. |
| 2005/0025999 A1 * | 2/2005 | Gill ..................... 428/694 TM |

* cited by examiner

*Primary Examiner*—Ngân V. Ngô
(74) *Attorney, Agent, or Firm*—Duane Morris LLP

(57) ABSTRACT

The invention relates to a magnetic memory with write inhibit selection and the writing method for same. Each memory element of the invention comprises a magnetic tunnel junction (70) consisting of: a magnetic layer, known as the trapped layer (71), having hard magnetisation; a magnetic layer, known as the free layer (73), the magnetisation of which may be reversed; and an insulating layer (72) which is disposed between the free layer (73) and the trapped layer (71) and which is in contact with both of said layers. The free layer (73) is made from an amorphous or nanocrystalline alloy based on rare earth and a transition metal, the magnetic order of said alloy being of the ferrimagnetic type. The selected operating temperature of the inventive memory is close to the compensation temperature of the alloy.

11 Claims, 6 Drawing Sheets

U.S. 7,129,555 B2

MAGNETIC MEMORY WITH WRITE INHIBIT SELECTION AND THE WRITING METHOD FOR SAME

This application is a 371 of PCT/FR02/03209 filed on Sep. 19, 2002.

TECHNICAL FIELD

The present invention relates to the field of magnetic memories, and especially of non-volatile random access magnetic memories enabling storage and reading of data into and from electronic systems. More specifically, it relates to magnetic random access memories, called M-RAMs, formed of a magnetic tunnel junction.

STATE OF THE ART

Memories based on the charge state of a capacitor (DRAM, SRAM, FLASH) become more and more sensitive to ionizing radiations (such as, for example, cosmic rays) as the dimension of elementary transistors becomes smaller. Further, ferroelectric-based memories (FRAM) exhibit serious aging problems. Recent developments in the magneto-electronic field have enabled designing a novel type of memory based on the magnetoresistance of magnetic junctions. In other words, their operating principle no longer rests upon the storage of an electric load, but on the relative orientation of the magnetization of the elements forming it. Such magnetic random access memories (MRAM) have many advantages: their rapidity (a few nanoseconds of write and read time), their non-volatility, their lack of fatigue upon reading and writing, their insensitivity to ionizing radiations. They are first likely to replace flash memories and, on the longer term, to replace DRAMs and SRAMs to become a universal memory.

In the first magnetic memories, the memory point was formed of a so-called giant magnetoresistance element, formed of a stacking of several alternately magnetic and non-magnetic metal layers. A detailed description of this type of structure may be found in documents U.S. Pat. No. 4,949,039 and U.S. Pat. No. 5,159,513 for basic structures, and in document U.S. Pat. No. 5,343,422 for the forming of a RAM from such basic structures. This type of memory, due to its architecture, enables forming of non-volatile memories with a simple technology, but which have a limited capacitance. Indeed, the fact for the memory elements to be series-connected along each line limits integration possibilities, since the signal becomes lower and lower as the number of elements increases.

The most promising structures use for each memory point a magnetic tunnel junction—MTJ, formed in its simplest form of two magnetic layers of different coercitivities, separated by a thin insulating layer. A description of such structures is given in publication Physics Letters, volume 54A (1975), page 225, or more recently in publications Journal of Magnetism and Magnetic Materials, volume 139 (1995), page L139, and Physical Review Letters, volume 74 (1995), page 3273. The use of these structures for the MRAM manufacturing has been initially described in document U.S. Pat. No. 5,640,343.

Presently, the most promising structure seems to be that described in document U.S. Pat. No. 6,021,065 and in publication Journal of Applied Physics, volume 81 (1997), page 3758, the principle of which is schematically shown in FIG. 1. As can be seen in FIG. 1, each element or memory point (10) is formed of the association of a CMOS transistor (12) and of an MTJ junction (11). Said junction (11) comprises at least one magnetic layer (20), called the free layer, one thin insulating layer (21), and one magnetic layer (22), called the locked layer. Preferentially, but non limitingly, the two magnetic layers are formed based on 3$d$ metals (Fe, Co, Ni) and their alloys, and the insulating layer is formed of alumina ($Al_2O_3$). Preferentially, the magnetic layer (22) is coupled with an antiferromagnetic layer (23) having the function of locking layer (22), so that its magnetization does not switch upon writing. Preferentially still, layer (22) may itself be formed of several layers, as described for example in document U.S. Pat. No. 5,583,725, to form a so-called synthetic antiferromagnetic layer. All these alterations, as well as others, are well known by those skilled in the art.

The architecture further comprises three line levels. The two line levels (14) (word line) and (15) (bit line), generally arranged with a 90° angle with respect to each other, are intended to transmit electric pulses capable of creating a magnetic field enabling switching of the magnetization of layer (20) in the writing process. The field pulses are generated by sending short current pulses (typically from 2 to 5 nanoseconds) with an intensity on the order of 10 mA along lines (14) and (15). The intensity of these pulses and their synchronization are adjusted so that only the magnetization of the memory point located at the crossing of these two lines can switch. An additional line level (16) (control line) is intended to control the opening or the closing of the channel of transistors (12) to be able to address each memory element individually. Transistors (12) are used as switches.

In write mode, the selected transistor (12) is in blocked or OFF mode, with no current running through it. A current pulse I is sent into the two lines (14) and (15) corresponding to the selected memory point (10). The amplitude of current pulse I is such that the created magnetic field is not sufficient to switch the memory points on lines (14) or (15), except at the intersection of said lines (14) and (15), where the joint contribution of the two lines is sufficient to have the magnetization of layer (20) of the memory point switch.

In read mode, transistor (12) is in saturated or ON mode by the sending of a positive current pulse in its base through control line (16), and the current flowing through it is maximum. A measurement current is then sent into line (14), which can cross the memory point having its transistor (12) in ON position only. With this current, a measurement of the resistance of junction (11) of the selected memory point (10) is performed. By comparison with a reference memory point not described herein, the corresponding state of memory point (10) (1 or 0) is thus determined.

As the process of writing into these memory points is described, the limits of such an architecture can be clearly understood:

Since the writing is ensured by an external magnetic field, it is subject to the individual switching field value of each memory point. If the switching field distribution function for all memory points is wide (indeed, it is not uniform due to construction constraints), the magnetic field on the selected memory point must be greater than the highest switching field in the distribution, at the risk of incidentally switching certain memory points located on the corresponding line and/or column, having its switching field, located in the low part of the distribution, smaller than the magnetic field generated by the line or column alone. Conversely, if it is desired to ensure that no memory point is written into over a line or a column alone, the write current must be limited to never exceed for these memory points the magnetic field corresponding to the low part of the distribution, at the risk of never writing into the selected memory point at the intersection of said lines and columns, if its switching field is in the high part of the distribution. In other words, this architecture with a magnetic field selection by means of conductor lines and columns may easily result in write addressing errors. Given that it is expected that the distribution function of the switching fields of memory points is all the wider as their dimension is small, since the geometry of the memory points (shape, unevennesses, defects) dominates the magnetization switching, this effect can only worsen in future product generations.

Further, this write mode only enables writing into a single memory point at once to minimize addressing error risks.

The object of the present invention specifically consists of overcoming such limitations.

SUMMARY OF THE INVENTION

The present invention aims at a magnetic memory of MTJ type, which minimizes addressing errors by inhibiting upon writing the memory points which must not be written into. For this purpose, it provides replacing usual ferromagnetic layers (20, 22), of the type described in relation with FIG. 1 based on 3d metals (Fe, Co, Ni) and their alloys, with ferrimagnetic amorphous alloys (FAA).

It thus provides a magnetic memory having each memory point formed of a magnetic tunnel junction, comprising:
a so-called locked magnetic layer having a rigid magnetization,
a so-called free magnetic layer having a magnetization that can be inverted,
an insulating layer, interposed between the free layer and the locked layer and at the respective contact of these two layers.

According to the present invention, the free layer is made of an amorphous or nanocrystallized alloy based on a rare earth and on a transition metal, the magnetic order of said alloy being of ferrimagnetic type, and the operating temperature of the memory is chosen to be close to the compensation temperature of said alloy.

The compensation temperature is defined as being the temperature at which the respective magnetizations of the rare earth atom sub-lattice and of the transition metal sub-lattice forming the FAA are perfectly compensated for, that is, they have equal amplitudes and opposite signs, whereby the resulting macroscopic magnetization is zero.

Each of the memory points is placed at the intersection of a lattice of electric conductors, advantageously crossed connectors, and connected at its base to a pass transistor and on the upper part to one of said crossed connectors.

In a first form of the present invention, the writing is performed at the level of a considered memory point by the simultaneous sending of electric current pulses in said crossed conductors, to generate a magnetic field for writing on said memory point to be written into, and of a heating current via said transistor.

According to another embodiment of the present invention, the writing is performed by sending current pulses into the crossed conductors corresponding to said memory point to be written into, and by heating the memory points into which it is desired to avoid writing (memory points to be inhibited) via the corresponding transistors, said heating current being selected so that the temperature of said memory points to be inhibited becomes greater than the compensation temperature of the ferrimagnetic alloy constitutive of the free layer of said memory points, said memory points to be inhibited thus exhibiting the magnetization of their free layer oriented according to the same direction as that of the free layer of the memory point to be written into.

The foregoing objects, features, and advantages of the present invention will be discussed in detail in the following non-limiting description of specific embodiments in connection with the accompanying drawings.

BRIEF DESCRIPTION OF THE DRAWINGS

FIG. 2$b$ is a curve showing the variation of the magnetization of an FAA versus temperature.

DETAILED DESCRIPTION OF THE PRESENT INVENTION

As briefly reminded hereafter, the operation of the memory according to the present invention rests on the implementation of a heating phase of the free FAA layer of the MTJ of the memory points forming it. The reference of this temperature rise is the so-called compensation temperature. This phenomenon will thus first be rapidly detailed.

Figure 1:
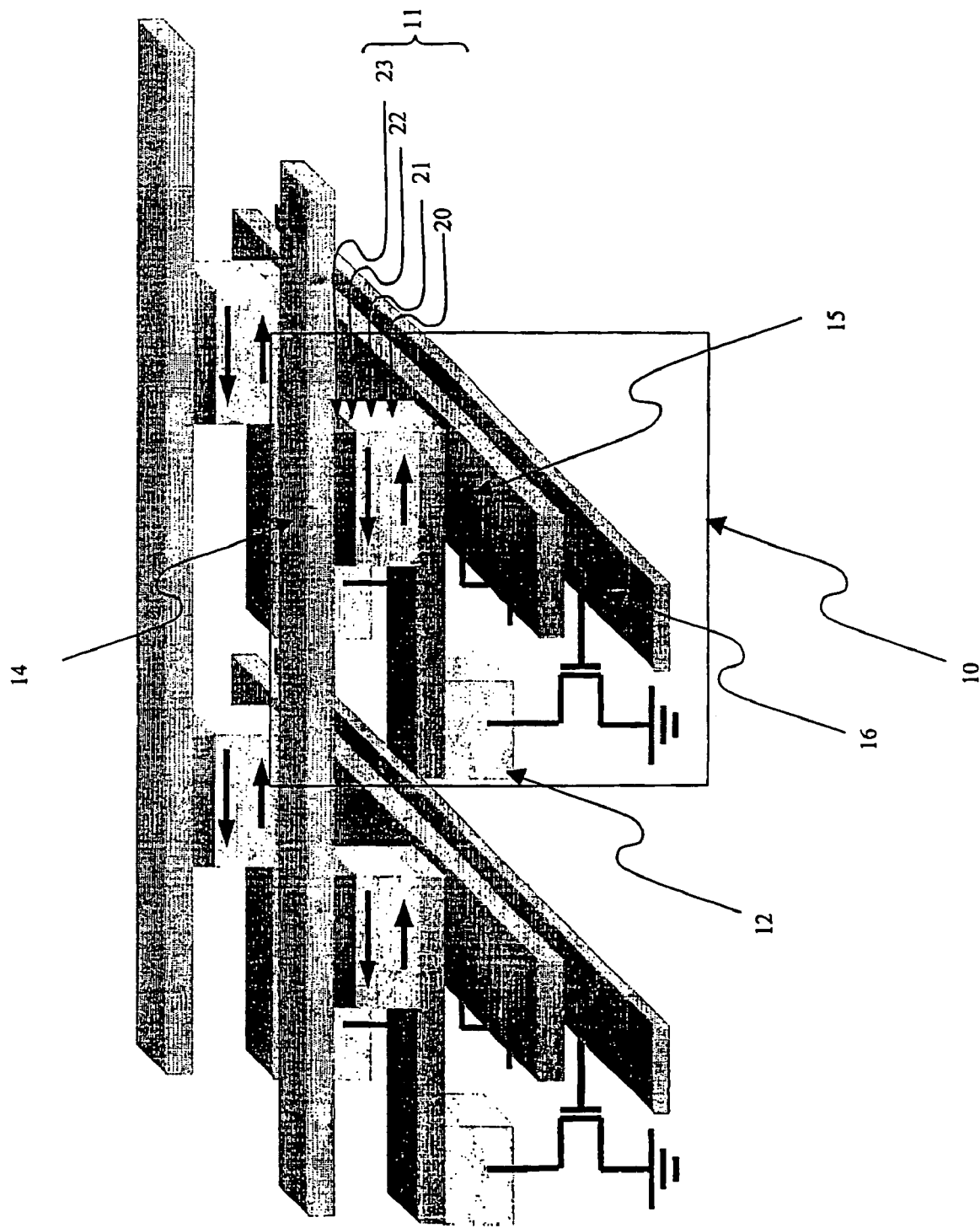
FIG. 1, previously described, is a simplified representation of the architecture of a magnetic memory of prior art having its memory points formed of an MTJ.
Figure 2A:
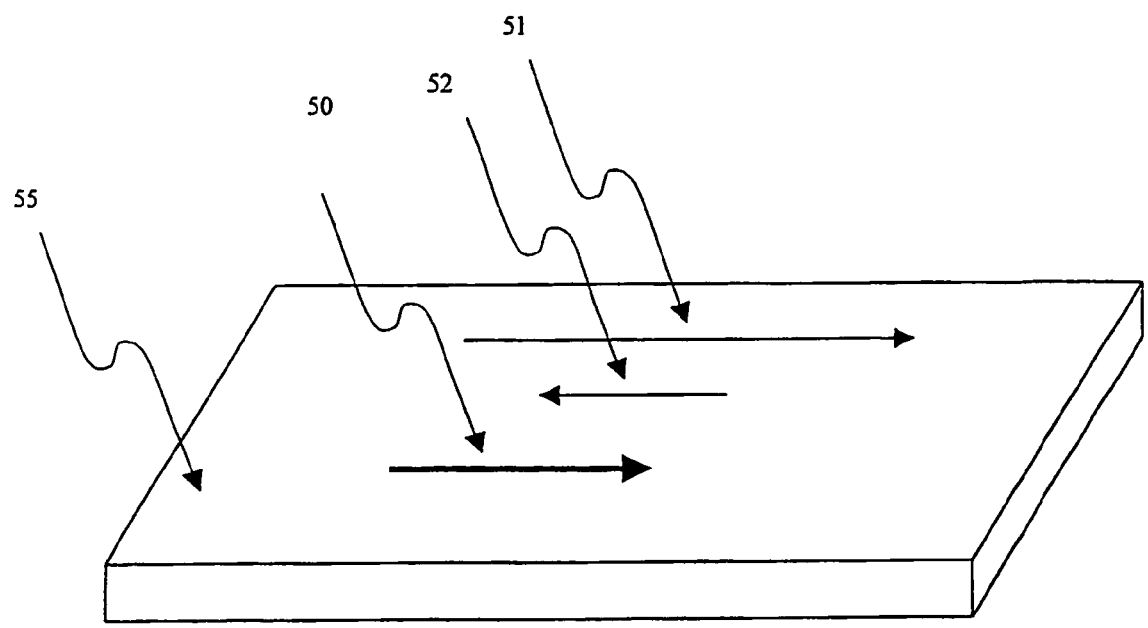
FIG. 2$a$ is a simplified representation of the magnetization of an FAA.
Figure 2B:
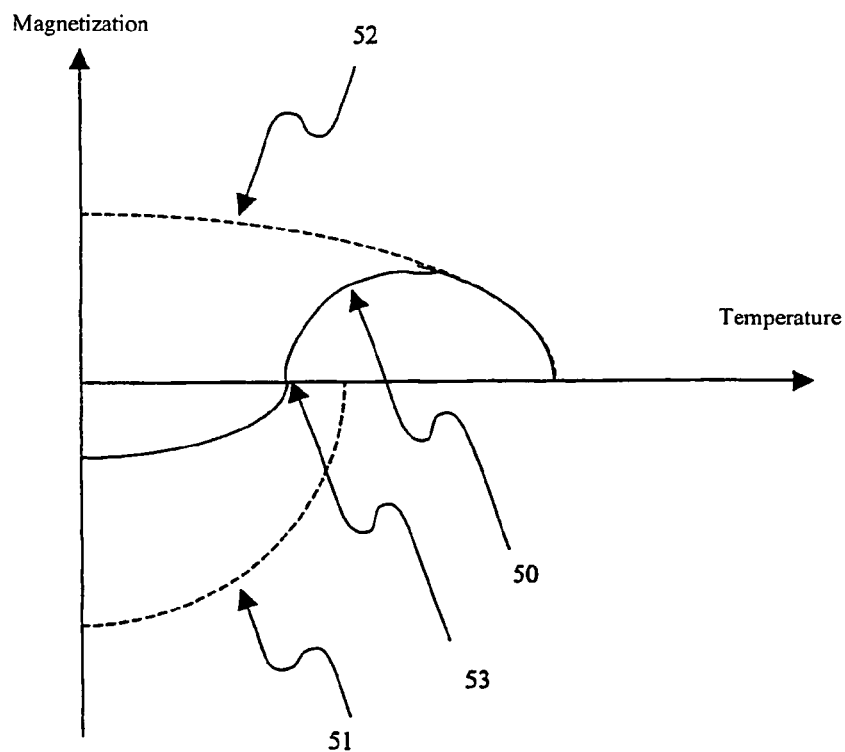

As can be observed from FIG. 2$a$, macroscopic magnetization (50) of a layer (55) of an FAA can be resolved into two contributions, one contribution due to rare earth atom sub-lattice (51) and one contribution due to transition metal atom sub-lattice (52). Schematically, macroscopic magnetization (50) results from the vectorial sum of the two sub-lattices (51) and (52).

Further, the magnetizations of rare earth lattice (51) and of transition metal sub-lattice (52) are strongly coupled together, resulting in a joint behavior upon switching of macroscopic magnetization (50) or reorientation by a selective excitation of one of sub-lattices (51) and (52).

Further, when the chemical nature and the relative composition of the rare earth and of the transition metal are judiciously selected, the magnetic order is of ferrimagnetic type, that is, the magnetization of the rare atom sub-lattice (51) points along one direction while the magnetization of the transition metal sub-lattice (52) points along the opposite direction. As can be seen in FIG. 2$a$, if the absolute value of magnetizations (51) and (52) of the two sub-lattices is not equal, the macroscopic magnetic moment (50) of the FAA as a whole is non-zero.

Further, as can be seen in FIG. 2$b$, the temperature variations of the magnetizations (51) of the rare earth sub-lattice, and (52) of the transition metal are very different, resulting in a variation with temperature of the relative significance of the contributions of the two sub-lattices to the resulting macroscopic magnetization. As a general rule, the magnetization of rare earth sub-lattice (51) decreases faster than the magnetization of transition metal sub-lattice (52). When the chemical nature and the relative composition of the rare earth and of the transition metal are judiciously chosen, for magnetizations (51) and (52) of the two sub-lattices to be antiparallel, there exists a temperature, called the compensation temperature (53), at which the two magnetizations are perfectly compensated for, that is, they have equal amplitudes and opposite signs, and thus the resulting macroscopic magnetization (50). Below the compensation temperature, rare earth sub-lattice (51) dominates and defines the direction of macroscopic magnetization (50). Above the compensation temperature, transition metal sub-lattice (52) dominates and determines the direction of the macroscopic magnetization (50).

Figure 4:
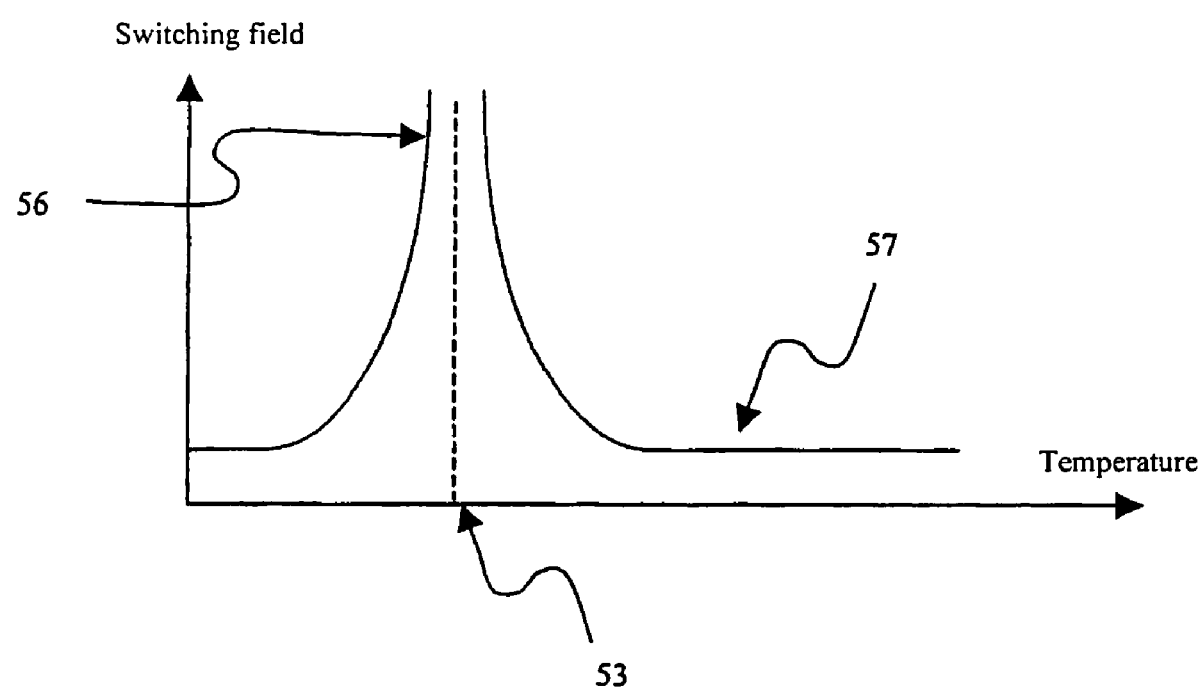
FIG. 4 is a curve representative of the variation of the magnetic switching field of the free FAA layer of an MTJ of the memory of the present invention according to temperature.

Further, at compensation temperature (53), the coercive field diverges and tends to infinity (see FIG. 4). On either side of the compensation temperature, the coercive field decreases all the faster as the temperature is close to the compensation temperature (53).

Further, the electrons contributing to the magnetization of transition metal sub-lattice (52) mainly are the conduction electrons ($3d$ electrons), that is, the electrons taking part in the electric current transmission. However, the electrons responsible for the magnetization of rare earth sub-lattice (51) are the core level electrons ($4f$ electrons) which are localized and strongly shielded by the other system electrons.

Finally, the intrinsic properties of these FAAs (macroscopic magnetization, magnetic anisotropy, coercive field) may be very easily controlled by the chemical nature of the involved elements and their respective concentrations. Small amounts of substitution elements, generally transition metals, refractory metals, or rare earths, for example, but non-limitingly, Ta, Mo, Nb, Zr, Pt, Dy, and Sm, may also be added for this purpose.

Among the FAAs considered in the present invention, one can preferentially, but non-limitingly, find the amorphous alloy of gadolinium (Gd) and cobalt (Co), which associates a ferrimagnetic order, a small magnetocrystalline anisotropy, and when the composition is judiciously selected, a compensation temperature close to the memory operating temperature, for example, $Gd_{25}Co_{75}$.

Figure 3:
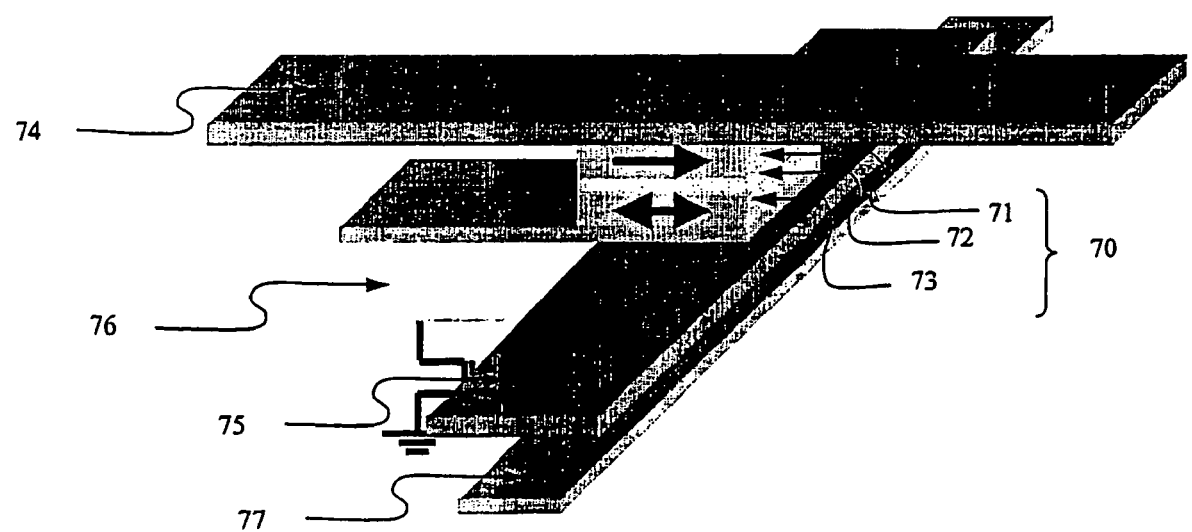
FIG. 3 is a simplified representation of a magnetic memory according to a first embodiment of the present invention.

As can be seen in FIG. 3, the memory point of a magnetic memory according to the present invention is formed of an MTJ (70) of FAA type comprising a magnetic layer (71) having a locked magnetization, an insulating layer (72) made of alumina, and an FAA alloy layer (73), the magnetization of which is desired to be switched to write into memory point (70). Two current conductor lines (74) and (75) cross at the memory point level. Upper conductor line (74) is at the contact of MTJ (70). The smaller conductor line (75) is electrically insulated from said MTJ. A control transistor (76) and its control line (77) are placed under and at the contact of memory point (70). All this is similar to the state of the art, except for the chemical nature of layers (71) and (73).

Advantageously, a layer of strong coercivity, for example, a Co-based alloy, or an antiferromagnetic layer, for example, a PtMn ordered alloy (not shown), may be placed on layer (71) to block its magnetization.

Advantageously, magnetic layer (71) may be formed of an FAA alloy identical to or different from layer (73), the switching field of which is large, for example, a samarium and cobalt based alloy, or yet a terbium and cobalt based amorphous alloy.

A memory point according to the present invention operates in the following manner, illustrated in relation with FIG. 4.

Operating temperature (56) of the memory is chosen to be close to compensation temperature (53) of layer (73), to guarantee significant memory point switching fields, since it diverges at the compensation temperature (53). Advantageously, the compensation temperature of layer (73) is slightly smaller than the operating temperature of the memory.

Upon writing, by a pulse in line (77), the control transistor (76) corresponding to the selected memory point (70) is turned off. The current flowing through the memory point is selected to be sufficient to heat said point to a temperature (57) much greater than compensation temperature (53), the heating being eased by the high resistivity of the FAA alloys used in layer (73). To this heating of memory point (70) is associated an abrupt fall in the switching field of layer (73) since said field varies very rapidly in the vicinity of the compensation temperature. A current pulse is then sent into excitation conductors (74) and (75), with a sign such that it enables switching of the magnetization of layer (73). Once the magnetization of layer (73) has been switched by the current pulse in lines (74) and (75), the heating current in line (77) is cut off, which brings the temperature of memory point (70) below compensation temperature (53) and the current pulses in conductors (74) and (75) are suppressed. The memory point is written into.

Upon reading, the process is identical to that described in prior art, that is, a reading of the resistance of the memory point by a current of small amplitude in line (77), which resistance is compared with that of a reference cell not described in FIG. 3.

The advantage of this architecture can be understood considering that the switching field very greatly varies with temperature in the vicinity of compensation temperature (53). Accordingly, it is possible to lower the switching field of the selected memory point to values much smaller than those of the other memory points in the network. In particular, a switching field of the selected memory point smaller than the lower limit of the switching field distribution of the memory as a whole may be obtained. The current pulse amplitude is thus sufficient to reverse the magnetization of the memory point, but not to reverse the magnetization of the unselected memory points, the temperature of which remains close to the operating temperature and this, whatever the value of the switching field in the distribution of said switching field of all the network memory points. The write selectivity is thus strongly increased, which results in eliminating addressing errors observed in the state of the art.

The use of a heating to favor the selection of a memory point is also possible with MTJs based on $3d$ metal alloys, as in the state of the art, but the much slower variation of the switching field along with temperature in such alloys requires heating to much higher temperatures, resulting in a greater consumed power and read time.

Advantageously, the heating current may be obtained by an external heating element not shown in FIG. 3.

Advantageously, this addressing technique enables simultaneous writing into several memory points, by selecting the simultaneous heating of several memory points. This approach enables increasing the general write speed of the memory.

Figure 5A:
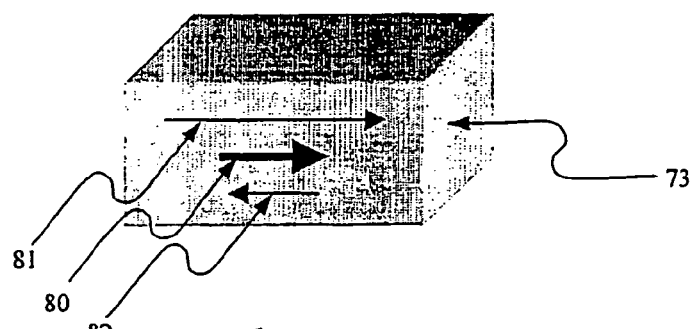
FIGS. 5$a$ to 5$d$ illustrate the operating mode of the magnetic memory according to another embodiment of the present invention.
Figure 5B:
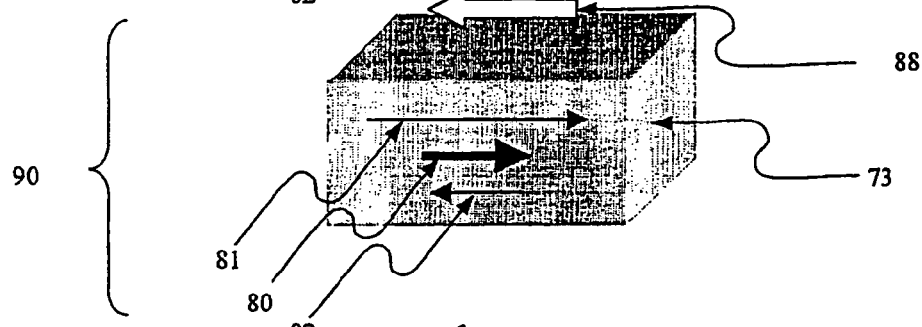

In an improved alteration of the present invention, the selection upon addressing is obtained by inhibiting the memory points which are not desired to be written into by a heating identical to that used for the selected point in the previously-described embodiment. In this case, as can be seen in FIG. 5a, the chemical nature and the composition of layer (73) are selected so that at the operating temperature when the memory is idle, the magnetic moment of rare earth atom sub-lattice (81) is greater than the magnetic moment of transition metal atom sub-lattice (82). Accordingly, macroscopic magnetization (80) of layer (73) points along the same direction as the magnetization of sub-lattice (81). Further, the operating temperature when the memory is idle is selected to be smaller than compensation temperature (53) of layer (73). The write process then is the following:

A current having an amplitude such that the magnetic field (88) created at the intersection of said conductors corresponding to the memory point to be written into has a sign opposite to the magnetization in the idle state of the memory point (90) to be written into, of which only layer (73) to be reversed is shown in FIG. 5b, is sent via conductors (74) and (75). The amplitude of the write magnetic field (88) thus created is much greater than the switching field of the selected memory point (90) to ensure its faultless writing into, whatever the switching field distribution of the memory point network.

Figure 5C:
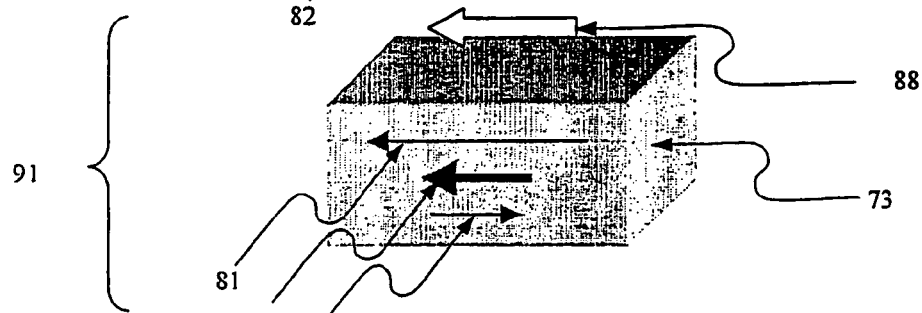

Simultaneously, the other memory points which are not desired to be written into are inhibited according to the following procedure: if memory point (91), forming one of the memory points to be inhibited, only layer (73) of which is shown in FIG. 5c, has a macroscopic magnetization (80) of direction opposite to the magnetization of memory point (90) to be written into, magnetic field (88) necessarily has the same direction as magnetization (80) of said memory point (91), and it thus is a stabilizing field. Accordingly, the state of memory point (91) is not affected, whatever the amplitude of the applied magnetic field (88).

Figure 5D:
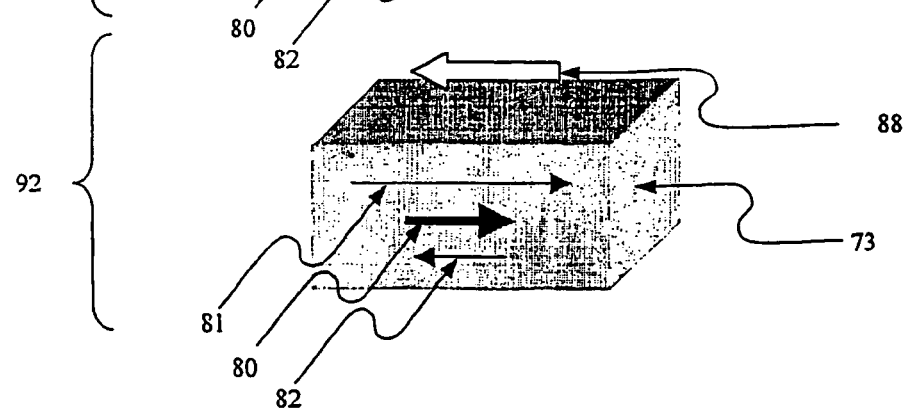
Figure 6A:
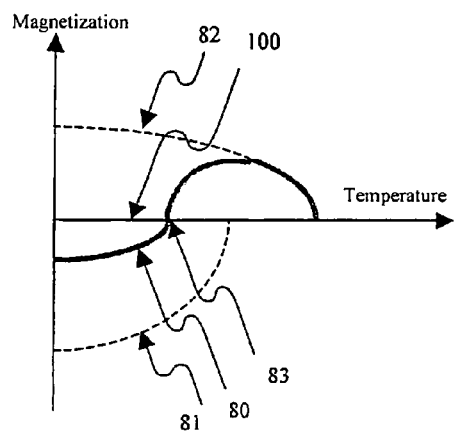
FIGS. 6$a$ to 6$c$ illustrate the operating mode of the inhibition of a memory point corresponding to the configuration of FIG. 5$d$.
Figure 6A:
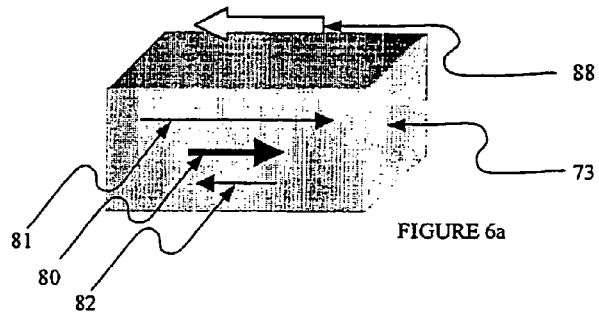
Figure 6B:
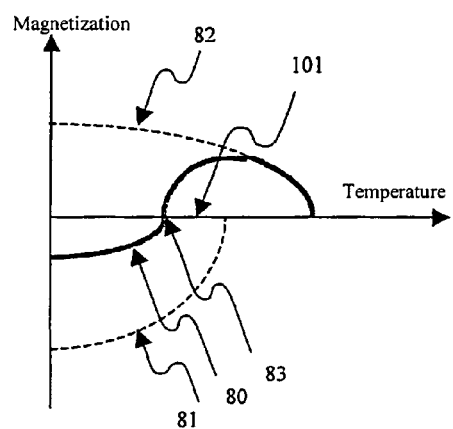
Figure 6B:
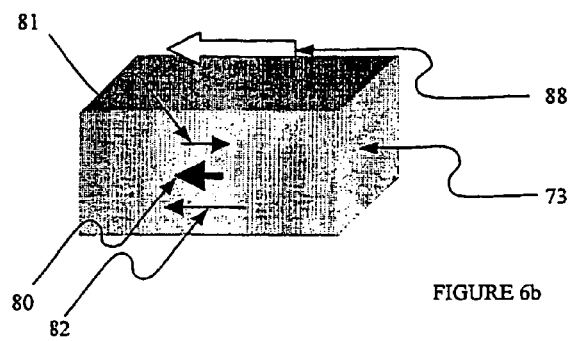
Figure 6C:
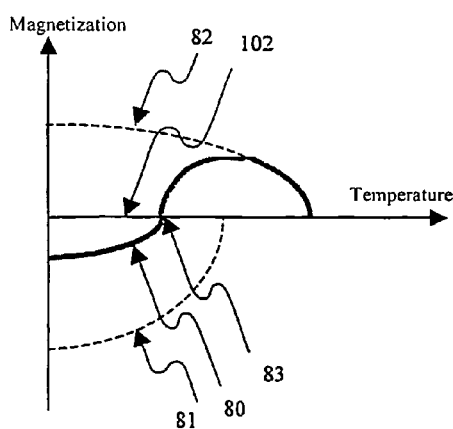
Figure 6C:
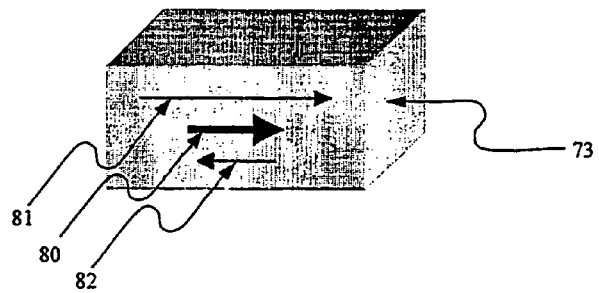

If memory point (92), also being one of the memory points to be inhibited, only layer (73) of which is shown in FIG. 5d, has a macroscopic magnetization (80) of same direction as memory point (90) to be written into, magnetic field (88) is opposite to magnetization (80) in the idle state, and there thus is a risk of erroneous writing. The writing into memory point (92) is thus inhibited by the following procedure: as can be seen from FIG. 6a, where only layer (73) of memory point (92) is shown, starting from idle temperature (100) of memory point (92), below compensation temperature (83), by controlling, before sending current pulses into lines (74) and (75), the turning-off of transistor (76) corresponding to memory point (92) by the sending of a current pulse into the corresponding line (77), memory point (92) is heated to a temperature (101) above compensation temperature (83) of the corresponding layer (73). Due to the specific properties of FAA alloys, the passing above compensation temperature (83) results in switching macroscopic magnetization (80) of memory point (92), since the relative contributions of the magnetization of rare earth atom sub-lattice (81) and the magnetization of transition metal atom sub-lattice (82) are inverted. By this heating procedure, macroscopic magnetization (80) of memory point (92) to be inhibited now has a direction opposite to what it was before the heating, and the write magnetic field (88) generated by conductors (74) and (75) now is a stabilizing field: the memory point magnetization is not switched. When the writing into the selected memory point (90) is over, write field (88) is first stopped by cutting off the current in conductors (74) and (75), after which the heating of memory point (92) to be inhibited is cut off. The corresponding layer (73) cools down below its compensation temperature and returns to its initial magnetization state at temperature (102) below compensation temperature (83), as can be seen from FIG. 6c, in which only layer (73) has been shown. Thus, by this procedure, the writing into memory point (92) is inhibited although the direction and the amplitude of write field (88) have corresponded to a write field.

The advantage of this inhibition technique is to eliminate any potential addressing error, since the write field is a stabilizing field on all memory points, whatever their magnetization state in the idle state, except on the selected memory point for which it can thus be much greater than the average switching field. Addressing errors are thus impossible.

Advantageously, this technique of addressing by inhibition also enables simultaneous writing into several memory points, since the selection is performed by the inhibition of the other memory points. The write process may advantageously be reduced to two steps: the simultaneous writing into all the memory points in a given direction, by saturating all the corresponding conductors and inhibiting the memory points of the opposite direction, and the simultaneous writing into all the memory points in the other direction by inverting the write (as well as the write current sign) and heating selections. The general memory write speed is maximized by this approach.

Advantageously, the heating current may be obtained by an external heating element not shown in FIG. 3.

Advantageously, the memory structure uses a single excitation conductor since, the amplitude of write field (88) no longer being the criterion for selecting the memory point to be written into, it is no longer necessary to use two crossed conductors to select the memory point to be written into at their intersection only. In this case, the memory is formed of a single (upper) field excitation conductor (74), and of a (lower) heating transistor control conductor (77). This architecture enables suppressing lower excitation line (75), which enables minimizing the elementary cell dimension, since the control transistor line (77) no longer requires offsetting with respect to memory point (70) to enable running of lower current line (75). Integration possibilities are thereby increased and manufacturing processes are simplified.

The invention claim is:

1. A magnetic memory having each of its memory points formed of a magnetic tunnel junction (70), comprising:
    a locked magnetic layer (71) having a rigid magnetization,
    a free magnetic layer (73) having a magnetization that can be inverted,
    an insulating layer (72), interposed between the free layer (73) and the locked layer (71) and at the respective contact of these two layers,
    wherein the free layer (73) is made of an amorphous or nanocrystallized alloy based on a rare earth and a transition metal, the magnetic order of said alloy being of ferrimagnetic type, and in that the operating temperature of the memory is chosen to be close to the compensation temperature of said alloy.

2. The magnetic memory of claim 1, wherein the free layer (73) is made of a gadolinium and cobalt alloy.

3. The magnetic memory of claim 1, wherein the free layer (73) further contains a small amount of one or several substitution elements.

4. The magnetic memory of claim 3, wherein the substitution elements are selected from the group comprising, for example, Zr, Ta, Mo, Nb, Dy, Sm, Pt.

5. The magnetic memory of claim 1, wherein the locked layer (71) is made of an amorphous alloy based on a rare earth and a transition metal, identical to or different from that constitutive of the free layer (73), the magnetic order in said alloy being of ferrimagnetic type.

6. The magnetic memory of claim 5, wherein the locked layer (71) is made of a terbium and cobalt based amorphous alloy.

7. The magnetic memory of claim 1, wherein the locked layer (71) is made of an amorphous alloy based on a rare earth and a transition metal, the magnetic order in said alloy being of ferromagnetic type.

8. The magnetic memory of claim 7, wherein the locked layer (71) is made of a samarium and cobalt alloy.

9. The magnetic memory of claim 1, wherein each memory point is placed at the intersection of a lattice of electric conductors (74, 75), a lower conductor (75) being electrically insulated from said memory points, each memory point being connected at its base to a pass transistor (76), the writing being performed in a considered memory point by the simultaneous sending of electric current pulses into said conductors (74, 75) and of a heating current via said transistor (76).

10. The magnetic memory of claim 1, wherein the temperature of the memory point upon writing is brought to a value greater than the compensation temperature (53) of the free layer (73) forming it.

11. A random access magnetic memory according to any of claims 1 to 10.

* * * * *